(12) United States Patent
Han et al.

(10) Patent No.: US 11,190,196 B2
(45) Date of Patent: Nov. 30, 2021

(54) SYSTEMS AND METHODS FOR SUPPRESSING EVEN HARMONICS IN A MOLECULAR CLOCK

(71) Applicant: Massachusetts Institute of Technology, Cambridge, MA (US)

(72) Inventors: Ruonan Han, Winchester, MA (US); Cheng Wang, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/071,319

(22) Filed: Oct. 15, 2020

(65) Prior Publication Data

US 2021/0119635 A1 Apr. 22, 2021

Related U.S. Application Data

(60) Provisional application No. 62/916,945, filed on Oct. 18, 2019.

(51) Int. Cl.
*H03L 7/26* (2006.01)
*H04B 1/10* (2006.01)
(Continued)

(52) U.S. Cl.
CPC .............. *H03L 7/26* (2013.01); *G01N 21/17* (2013.01); *G04F 5/145* (2013.01); *H01P 3/122* (2013.01);
(Continued)

(58) Field of Classification Search
CPC . H03L 7/0922; H03L 7/00; H03L 7/26; H03L 7/099; H03B 17/00; H01P 3/122;
(Continued)

(56) References Cited

U.S. PATENT DOCUMENTS 5,838,206 A 11/1998 Busca et al.
7,808,439 B2 10/2010 Yang et al.
(Continued)

OTHER PUBLICATIONS

Zhang, "Substrate Integrated Waveguide Devices and Receiver Systems for Millimeter-Wave Applications;" Département de génie électrique Polytechnique de Montréal; Sep. 2011; 44 pages.
(Continued)

*Primary Examiner* — Arnold M Kinkead
(74) *Attorney, Agent, or Firm* — Daly, Crowley, Mofford & Durkee, LLP

(57) ABSTRACT

In some embodiments, a molecular clock includes a waveguide gas cell containing gas molecules having a rotational spectral line with a first frequency a voltage-controlled oscillator (VCO) to generate a clock signal, a transmitter referenced to the clock signal to generate a probing signal for transmission through the waveguide gas cell, and a receiver to receive the probing signal transmitted through the waveguide gas cell and interacting with gas molecules. The receiver can include a filter circuit configured to filter out even harmonic components from the received signal and can further include a lock-in detector to generate an error signal indicating an offset between the first frequency and the second frequency. The error signal is fed back to control generation of the VCO clock signal.

20 Claims, 10 Drawing Sheets

(51) Int. Cl.
H03L 7/099 (2006.01)
G04F 5/14 (2006.01)
G01N 21/17 (2006.01)
H03B 17/00 (2006.01)
H01P 3/12 (2006.01)

(52) U.S. Cl.
CPC .............. *H03B 17/00* (2013.01); *H03L 7/099* (2013.01); *H04B 1/1027* (2013.01)

(58) Field of Classification Search
CPC ......... G04F 5/14; G04F 5/145; H04B 1/1027; G01N 21/17
USPC ............. 331/3, 94.1; 324/464, 520; 359/326
See application file for complete search history.

(56) References Cited

U.S. PATENT DOCUMENTS

| | | | |
|---|---|---|---|
| 10,739,728 | B2* | 8/2020 | Han ...................... H03L 7/1976 |
| 2006/0158172 | A1 | 7/2006 | King |
| 2007/0170981 | A1 | 7/2007 | Burt et al. |
| 2007/0247241 | A1 | 10/2007 | Braun et al. |
| 2009/0122775 | A1 | 5/2009 | Haartsen |
| 2010/0111750 | A1 | 5/2010 | Touchberry et al. |
| 2012/0086114 | A1 | 4/2012 | Zhao et al. |
| 2013/0316659 | A1 | 11/2013 | Ylamurto |
| 2014/0086364 | A1 | 3/2014 | Schell et al. |
| 2014/0267129 | A1 | 9/2014 | Rebeschi et al. |
| 2015/0133068 | A1 | 5/2015 | Aggarwal et al. |
| 2016/0181681 | A1 | 6/2016 | Sarabandi et al. |
| 2016/0190670 | A1 | 6/2016 | Carmon et al. |
| 2018/0041166 | A1 | 2/2018 | Han et al. |
| 2018/0278441 | A1 | 9/2018 | Ross et al. |
| 2019/0058479 | A1 | 2/2019 | Mo et al. |
| 2019/0235445 | A1 | 8/2019 | Han et al. |

OTHER PUBLICATIONS

Eshrah, et al., "Analysis of Waveguide Slot-Based Structures Using Wide-Band Equivalent-Circuit Model;" IEEE Transactions on Microwave Theory and Techniques; vol. 52, No. 12; Dec. 2004; 6 pages.
PCT International Search Report and Written Opinion dated Feb. 9, 2021 for International Application No. PCT/US2020/056441; 17 pages.
U.S. Appl. No. 17/074,918, filed Oct. 20, 2020, Han, et al.
PCT International Search Report and Written Opinion dated Jan. 15, 2021 for International Application No. PCT/US2020/055663; 15 pages.
Antonio, et al.; "Frequency stabilization in nonlinear micromechanical oscillators"; Nature Communications; 3:806; May 1, 2012; 6 Pages.
Bottom; "A History of the Quartz Crystal Industry in the USA"; Proceedings of the 35th Annual Frequency Control Symposium; pp. 3-12; May 1981; IEEE; 15 Pages.
Camparo; "The rubidium atomic clock and basic research"; 2007 American Institute of Physics; S-0031; Nov. 2007; 12 Pages.
Cox; et al.; "Zeeman Effect of Some Linear and Symmetric-Top Molecules"; Physical Review; vol. 101; No. 4; Feb. 15, 1956; pp. 1298-1304; 7 Pages.
Cyr, et al.; "All-optical microwave frequency standard: a proposal"; IEEE Transactions on Instrumentation and Measurement; vol. 42; No. 2; Apr. 1993; pp. 640-649; 10 Pages.
DeNatale, et al.; "Compact, low-power chip-scale atomic clock"; 2008 IEEE/ION Position, Location and Navigation Symposium; May 5, 2008; pp. 67-70; 4 Pages.
Esnault, et al.; "A compact cold-atom frequency standard based on coherent population trapping"; Frequency Control Symposium (FCS); 2012 IEEE International, May 2012; pp. 1-3; 3 Pages.
Essen, et al.; "An atomic standard of frequency and time interval: a caesium resonator"; 1955 Nature Publishing Group; Aug. 13, 1955; vol. 176; pp. 280-282; 3 Pages.

Essen; "Frequency Standardization"; Proc. IEE—Part II; Power Eng.; Jan. 1951; pp. 154-164; 11 Pages.
Fernández, et al.; "CSAC characterization and its impact on GNSS clock augmentation performance"; Sensors 2017; 17; 370; www.mdpi.com/journal/sensors; Feb. 14, 2017; 19 Pages.
Good; "The inversion spectrum of ammonia"; 1946 American Physical Society; Phys. Rev. 70; 213; Aug. 1, 1946; http://courses.washington.edu/phys432/NH3/ammonia_inversion.pdf; 22 Pages.
Haesler, et al.; "The integrated swiss miniature atomic clock"; 2013 Joint IEEE Ultrasonics, Ferroelectrics and Frequency Control Society (UFFC), European Frequency and Time Forum (EFTF), and Piezoresponse Force Microscopy (PFM) Symposium; pp. 579-581; 2013 IEEE; 3 Pages.
Hershberger, et al.; "servo theory applied to frequency stabilization with spectral lines"; Journal of the Franklin Institute; vol. 249; Issue 5; May 1950; pp. 359-366; 8 Pages.
Jet Propulsion Laboratory; Molecular Spectroscopy Catalog; https://spec.jpl.nasa.gov/; 1 Page.
Koshelev, et al.; "Speed dependence of collisional relaxation in ground vibrational state of OCS: Rotational behavior"; The Journal of Chemical Physics 136; Mar. 30, 2012; 12 Pages.
Lutwak; "The chip-scale atomic clock—recent developments"; 2009 IEEE International Frequency Control Symposium Joint with the 22nd European Frequency and Time Forum; Apr. 20, 2009; pp. 573-577; 5 Pages.
Lutwak; "The SA.45S chip-scale atomic clock—early production statistics"; Proceedings of the 43rd Annual Precise Time and Time Interval Systems and Applications Meeting; Nov. 14, 2011; pp. 207-220; 12 Pages.
Microsemi; "shock and vibration testing of the SA.45s chip scale atomic clock (CSAC) validation build units"; Aug. 2014; White Paper; 36 Pages.
Microsemi; Quantum™; "SA.54s chip scale atomic clock"; Jan. 2017; Data Sheet; 4 Pages.
Nguyen et. al.; "Towards chip-scale atomic clocks"; 2005 IEEE International Solid-State Circuits Conference (ISSCC); Feb. 7, 2005; Digest of Technical Papers; pp. 84-85; 2 Pages.
Rautian; "The Effect of Collisions on the Doppler Broadening of Spectral Lines"; Soviet Physics Uspekhi; vol. 9; No. 5.; Mar.-Apr. 1967; pp. 701-716; 17 Pages.
Ruffieux, et al.; "A Low-Power Fully Integrated RF Locked Loop for Miniature Atomic Clock"; 2011 IEEE International Sold-Sate Circuits Conference (ISSCC); pp. 48-49; Feb. 21, 2011; 3 Pages.
Supplee, et al.; "Theoretical description of frequency modulation and wavelength modulation spectroscopy"; Applied Optics; vol. 33; No. 27; Sep. 20, 1994; pp. 6294-6302; 9 Pages.
Townes; "Atomic clocks and frequency stabilization on microwave spectral lines"; Journal of Applied Physics; vol. 22; No. 11; Nov. 1951; pp. 1365-1372; 9 Pages.
Vanier, et al.; "On the signal-to-noise ratio and short-term stability of passive rubidium frequency standards"; IEEE Transactions on Instrumentation and Measurement; vol. IM-30; No. 4, Dec. 1981; pp. 277-282; 6 Pages.
Wang, et al.; "Rapid and Energy-Efficient Molecular Sensing Using Dual mm-Wave Combs in 65nm CMOS: A 220-to-320GHz Spectrometer with 5.2mW Radiated Power and 14.6-to-19.5dB Noise Figure"; 2017 IEEE International Solid-State Circuit Conference (ISSCC); Feb. 7, 2017; pp. 18-20; 3 Pages.
Wang, et al.; "Robust sub-harmonic mixer at 340 GHz using intrinsic resonances of hammer-head filter and improved diode model"; Journal of Infared, Millimeter, and Terahertz Waves; Nov. 2017; vol. 38; Issue 11; pp. 1397-1415; 19 Pages.
Wang, et al.; "Duel-Terahertz-Comb Spectrometer on CMOS for Rapid, Wide-Range Gas Detection with Absolute Specificity"; IEEE Journal of Solid-State Circuits (JSSC); vol. 52; No. 12; Dec. 2017; pp. 3361-3372; 12 Pages.
Wineland et al.; "Results with the special-purpose ammonia frequency standard"; 31st Annual Symposium on Frequency Control; Jun. 1, 1977; pp. 562-573; 12 Pages.
Wineland et al.; "Special Purpose Ammonia Frequency Standard—A Feasibility Study"; IEEE TraSnsactions on Instrumentation and Measurement; vol. IM-28; No. 2; Jun. 1979; pp. 122-132; 11 Pages.

(56) References Cited

OTHER PUBLICATIONS

Youngner, et al.; "A manufacturable chip-scale atomic clock"; Transducers & Eurosensors 2007; The 14th International Conference on Solid-State Sensors, Actuators and Microsystems, Lyon, France; Jun. 10, 2007; pp. 39-44; 2007 IEEE; 6 Pages.

PCT International Search Report dated Mar. 6, 2019 for International Application No. PCT/US2018/067642; 4 Pages.

PCT International Written Opinion dated Mar. 6, 2019 for International Application No. PCT/US2018/067642; 5 Pages.

Kabourek et al.; "Prague's Emission Fourier Transform Microwave Spectrometer—Design and Preliminary Results"; Radioengineering; vol. 22; No. 4; Dec. 1, 2013; [Retrieved on Feb. 24, 2019]; Retrieved from the Internet: <URL: https://www.radioeng.cz/fulltexts/2013/13_04_1288_1295.pdf>; 8 Pages.

Wang et al.; "High-Stability, Miniature Terahertz Molecular Clock on CMOS"; MTL Annual report; Jul. 2017; [Retrieved on Feb. 24, 2019]; Retrieved from the Internet: <URL: https://mtlsites.mit.edu/annual_reports/2017/circuits.pdf> p. 36; 1 Page.

\* cited by examiner

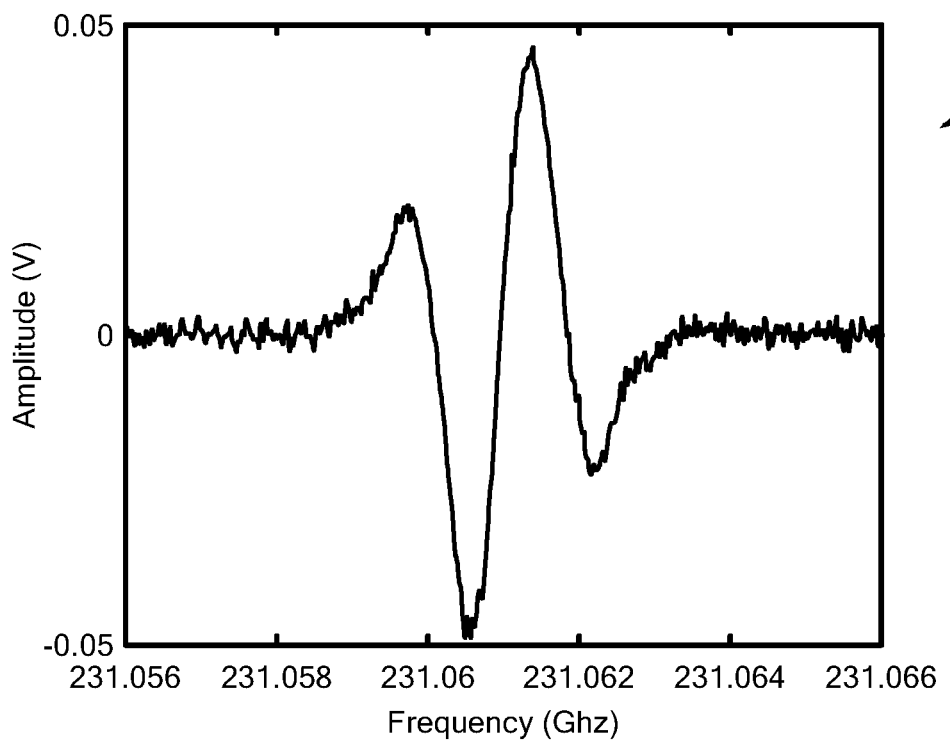
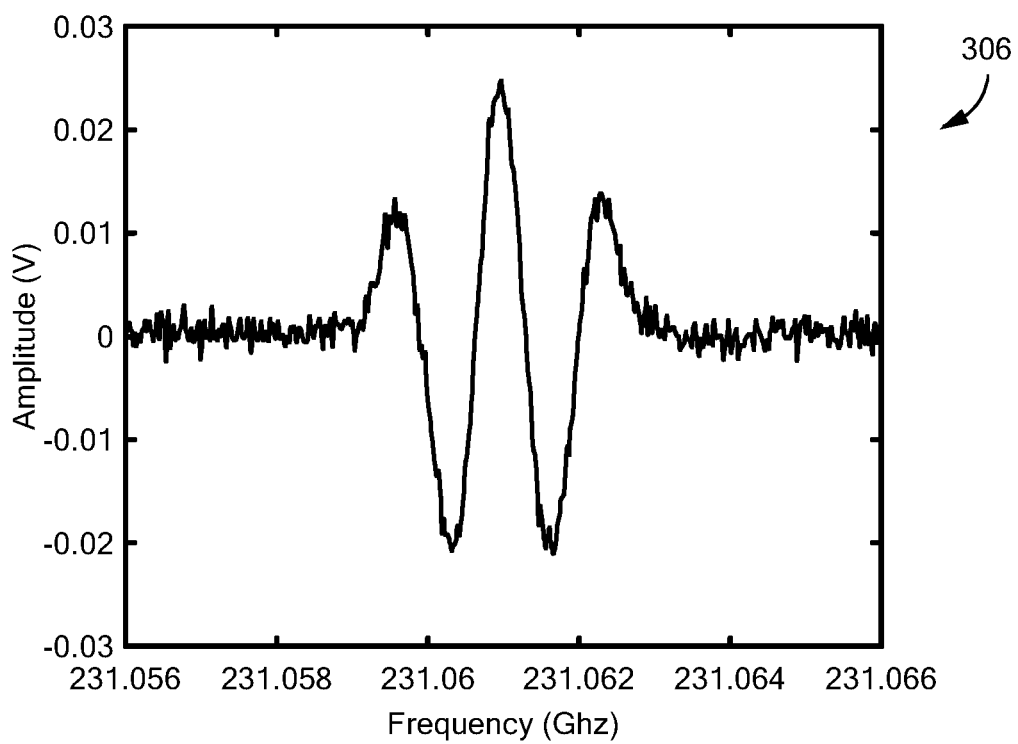
*FIG. 3 (cont.) (cont.)*

SYSTEMS AND METHODS FOR SUPPRESSING EVEN HARMONICS IN A MOLECULAR CLOCK

CROSS-REFERENCE TO RELATED APPLICATIONS

This application claims the benefit under 35 U.S.C. § 119 of provisional patent application No. 62/916,945 filed on Oct. 18, 2019, which is hereby incorporated by reference herein in its entirety.

STATEMENT REGARDING FEDERALLY SPONSORED RESEARCH

This invention was made with Government support under Grant No. ECCS1653100 and ECCS1809917 awarded by the National Science Foundation. The Government has certain rights in the invention.

BACKGROUND

Electronic devices require highly stable, portable, and energy-efficient reference signal sources which can provide a reference signal having a stable output frequency (such reference signal sources are sometimes simply referred to as "reference sources" or "clocks"). Such a clock is described in U.S. Pat. No. 10,739,728, filed on Dec. 27, 2018 and entitled "Molecular Clock," the content of which is hereby incorporated by reference in its entirety. This type of molecular clock and implementation methods are also described in the following publications, the content of which is hereby incorporated by reference in their entirety: C. Wang, X. Yi, J. Mawdsley, M. Kim, Z. Wang, R. Han, "An on-chip fully-electronic molecular clock based on sub-terahertz rotational spectroscopy," Nature Electronics, Vol. 1, No. 7, pp. 1-7, July 2018; C. Wang, X. Yi, J. Mawdsley, M. Kim, Z. Hu, Y. Zhang, B. Perkins, R. Han, "Chip-Scale Molecular Clock", IEEE Journal of Solid-State Circuits (JSSC), Vol. 54, No. 4, pp. 914-926, April 2018; and C. Wang, X. Yi, M. Kim, Y. Zhang, and R. Han, "A CMOS Molecular Clock Probing 231.061-GHz Rotational Line of OCS with Sub-ppb Long-Term Stability and 66-mW DC Power," 2018 Symposium on VLSI Circuits (VLSI), Honolulu, Hi., 2018, pp. 113-114.

Electronic systems in navigation, telecommunication network synchronization and various sensing (e.g. magnetometry) applications typically utilize high performance clocks to help ensure proper operation. The use of a high performance clock can be particularly important in equipment which may operate in environments in which a global positioning system (GPS) signal is not available (e.g. underwater sensors). In portable equipment other clock features such as compact size and high energy efficiency become increasingly more important.

SUMMARY

Described herein is a molecular clock system that includes a spectrometer and an even harmonic eliminator that, in some instances, is a N-path notch filter. The need for an even harmonic eliminator is due to the baseband gain GBB limitations present as a result of the existence of even-order harmonics. Using a N-path notch filter to filter out the even-order harmonics can also enable the gain, GBB, to be boosted by 20 dB as the modulated spectral signal is processed by the 8-path N-path notch filter. The even harmonic eliminator can be fully integrated on-chip due to the high-impedance buffer stages with NMOS feedback of the N-path notch filter. In some instances, the system also includes a low-pass filter used to filter out up-converted frequency components generated as a result of the 2 fm clock frequency of the even harmonic eliminator.

According to one aspect of the present disclosure, a molecular clock includes: a waveguide gas cell containing gas molecules having a rotational spectral line with a first frequency; a voltage-controlled oscillator (VCO) to generate a clock signal; a transmitter referenced to the clock signal to generate a probing signal for transmission through the waveguide gas cell; and a receiver to receive the probing signal transmitted through the waveguide gas cell and interacting with gas molecules. The receiver can include: a filter circuit configured to filter out even harmonic components from the received signal; and a lock-in detector to generate an error signal indicating an offset between the first frequency and the second frequency, wherein the error signal is fed back to control generation of the VCO clock signal.

In some embodiments, the filter circuit comprises a N-path notch filter. In some embodiments, the N-path notch filter comprises an input buffer and an output buffer. In some embodiments, the input buffer and output buffer each comprise a transconductance amplifier. In some embodiments, the input buffer and output buffer each comprise a high impedance buffer. In some embodiments, the N-path notch filter comprises multiple switches, each switch configured to oscillate at a frequency equal to twice a modulation frequency of the spectrometer. In some embodiments, the gaseous molecules comprise gaseous molecules having a linear structure, such as carbonyl sulfide compound (OCS).

According to one aspect of the present disclosure, a molecular clock includes: a waveguide gas cell having a radio frequency (RF) input port, a RF output port and a gas inlet and outlet; a spectrometer configured to wavelength modulate a spectral signal from gaseous molecules contained within the waveguide gas cell; and a filter circuit configured to filter out even harmonic components from the wavelength modulated spectral signal.

In some embodiments, the gaseous molecules comprise gaseous molecules having a linear structure, such as carbonyl sulfide compound (OCS). In some embodiments, the carbonyl sulfide compound OCS is provided having a rotational spectrum in the frequency range of about 12 GHz to about 1 THz or in the range of about 200 GHz to about 300 GHz. In some embodiments, the spectral signal from the gaseous molecules comprises a rotational spectral line. In some embodiments, the filter circuit comprises a N-path notch filter. In some embodiments, the N-path notch filter comprises an input buffer and an output buffer. In some embodiments, the input buffer and output buffer each comprise a transconductance amplifier. In some embodiments, the input buffer and output buffer each comprise a high impedance buffer. In some embodiments, the N-path notch filter comprises multiple switches, each switch configured to oscillate at a frequency equal to twice a modulation frequency of the spectrometer. In some embodiments, the molecular clock can include a low-pass filter configured to remove up-converted frequency components from the spectral signal.

BRIEF DESCRIPTION OF THE DRAWINGS

The manner of making and using the disclosed subject matter may be appreciated by reference to the detailed description in connection with the drawings, in which like reference numerals identify like elements. Reference characters introduced in a figure may be repeated in one or more subsequent figures without additional description in the detailed description in order to provide context for other features of the described embodiments.

The drawings are not necessarily to scale, or inclusive of all elements of a system, emphasis instead generally being placed upon illustrating the concepts, structures, and techniques sought to be protected herein.

DETAILED DESCRIPTION

Reference is sometimes made herein to a waveguide gas cell operable with a carbonyl sulfide compound (OCS). It should be appreciated that such reference is made only to promote clarity in the description of the concepts sought to be protected and are not intended to be and should not be construed as limiting. Those of ordinary skill in the art will appreciate that the molecular clock described herein may be implemented via any gas with molecules having a rotational spectrum of linear polar molecules. Reference is also sometimes made herein to $^{16}O^{12}C^{32}S$. Again, such reference is made only to promote clarity in the description of the broad concepts described herein. After reading the description herein, those of ordinary skill in the art will appreciate that that other isotopes, may of course, also be used. For example, alternative isotopes include, but are not limited to $^{16}O^{12}C^{33}S$, $^{16}O^{12}C^{34}S$, $^{16}O^{13}C^{32}S$ and $^{18}O^{12}C^{32}S$.

Mechanical oscillators, such as crystal oscillators (e.g. quartz crystal oscillators) and microelectromechanical systems (MEMS) oscillator have been widely adopted to provide a high performance clock in systems where GPS is not available. Although excellent in short-term stability, such mechanical oscillators suffer from long-term frequency drift due to disturbances from the environment, such as temperature variation and mechanical vibration. This leads to instability well beyond the parts per billion ($10^{-9}$) level.

Molecular clocks can be used to address the deficiencies in various oscillators. These molecular clocks can be highly stable time-based generators that stabilize electrical oscillation by locking onto the rotational energy level transition frequency of polar gaseous molecules such as Carbonyl Sulfide. Such atomic clocks can take advantage of advances in silicon microelectronic technology that enable on-chip integration of millimeter-wave/terahertz (THz) spectroscopic systems, and use such technology to create low-cost, low-power, miniaturized clocks. These clocks can reference a set of frequency bases, i.e., rotational-state transitions of gaseous polar molecules, and in particular, rotational-state transitions of gaseous polar molecules in the sub-THz region. Such a clock is able to generate a highly stable clock signal and achieve frequency stability characteristics which are the same as or similar to those achieved using a chip-scale atomic clock (CSAC). In many instances, these molecular clocks can use a rotational spectral line of gaseous molecules in sub-THz region.

Figure 1:
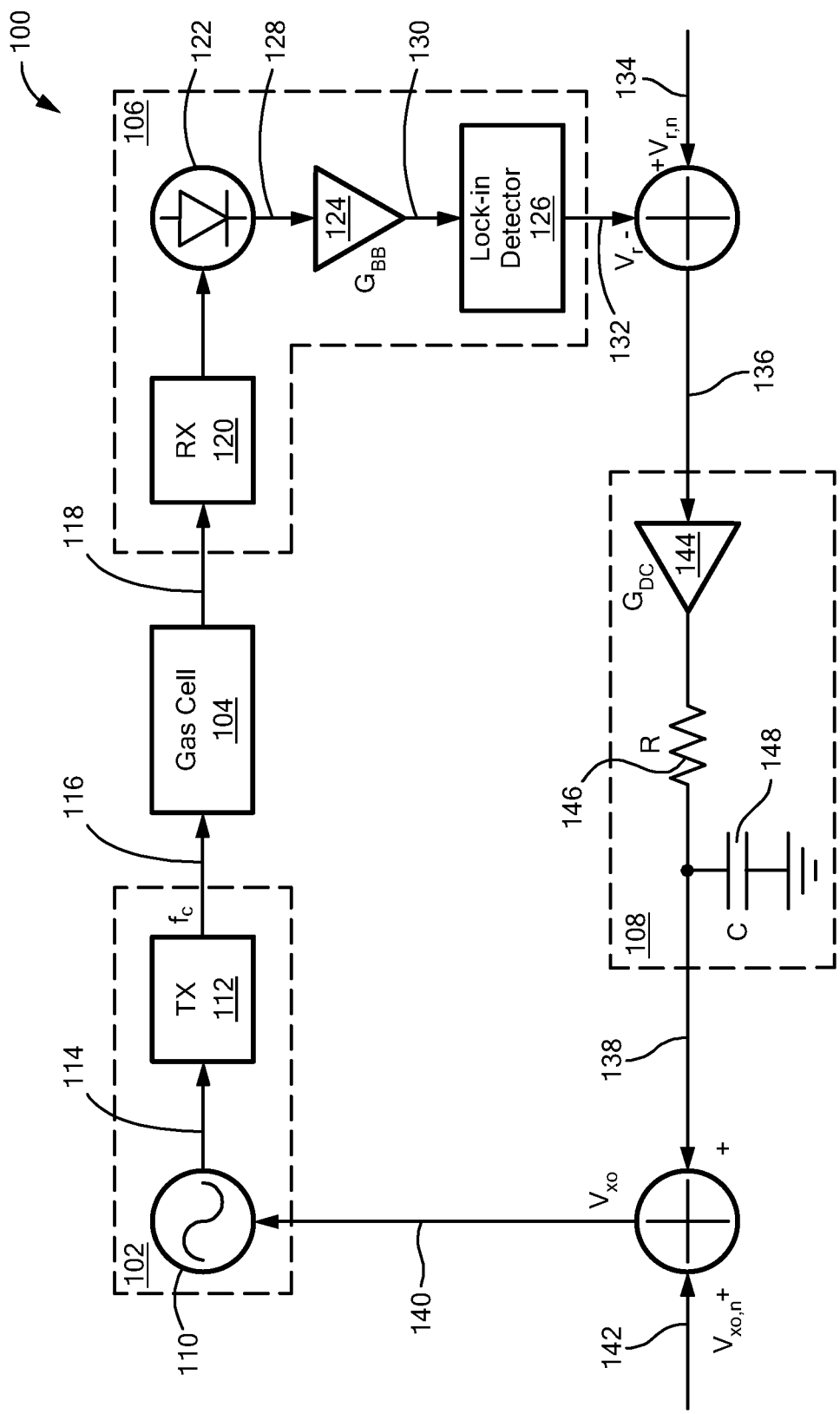
FIG. 1 is a schematic diagram of a molecular clock, account to some embodiments of the present disclosure.

Referring to FIG. 1, a molecular clock 100 includes a transmitter 102, a waveguide gas cell 104, a receiver 106, and baseband circuitry 108. The transmitter 102 includes an RF voltage-controlled oscillator (VCO) 110 and transmit circuitry 112. VCO 110 is configured to generate a clock signal 114 having a frequency $f_{clock}$ (e.g., $f_{clock}$=80 MHz). In some embodiments, VCO 110 may be provided as a voltage-controlled crystal oscillator (VCXO). VCO 110 can be controlled by a control signal 138 ($V_{xo}$). VCO 110 may be subject to various types of noise (e.g., phase noise) which is represented in FIG. 1 by noise signal 142 with noise spectrum density $V_{xo,n}$ that is added to control signal 138 ($V_{xo}$) to generate a "noisy" VCO control signal 140, as shown.

Transmit circuitry 112 can include circuit components to generate a probing signal 116 having a center frequency $f_c$ (e.g., $f_c \approx 231.061$ GHz). The probing signal center frequency, $f_c$, may be selected to approximately match the frequency, $f_0$, of a rotational spectral line of OCS or another gas molecule contained within gas cell 104 (e.g., $f_0$=231.060983 GHz in the case of OCS). Probing signal 116 can be modulated using, for example, wavelength modulation or frequency-shift keying (FSK) with modulation frequency $f_m$ and frequency deviation $\Delta f$. One or more components of transmit circuitry 112 can be referenced to the clock signal 114 provided by VCO 110.

Waveguide gas cell 104 includes an RF input port coupled to an output port of transmitter 102 and an RF output port coupled to an input port of receiver 106. In some embodiments, the gas cell 104 input/output port can be provided as chip-to-waveguide transitions using quartz probes. Gas cell 104 may contain gaseous molecules having a linear structure, such as OCS molecules. Gas cell 104 may include gas inlet and outlet ports via which gas can be pumped into and out of the gas cell 104. The gaseous molecules within gas cell 104 have a rotational spectral line with frequency $f_0$. The probing signal 116 passes through gas cell 104 and interacts with the gaseous molecules therein to generate an RF output signal 118.

Figure 2:
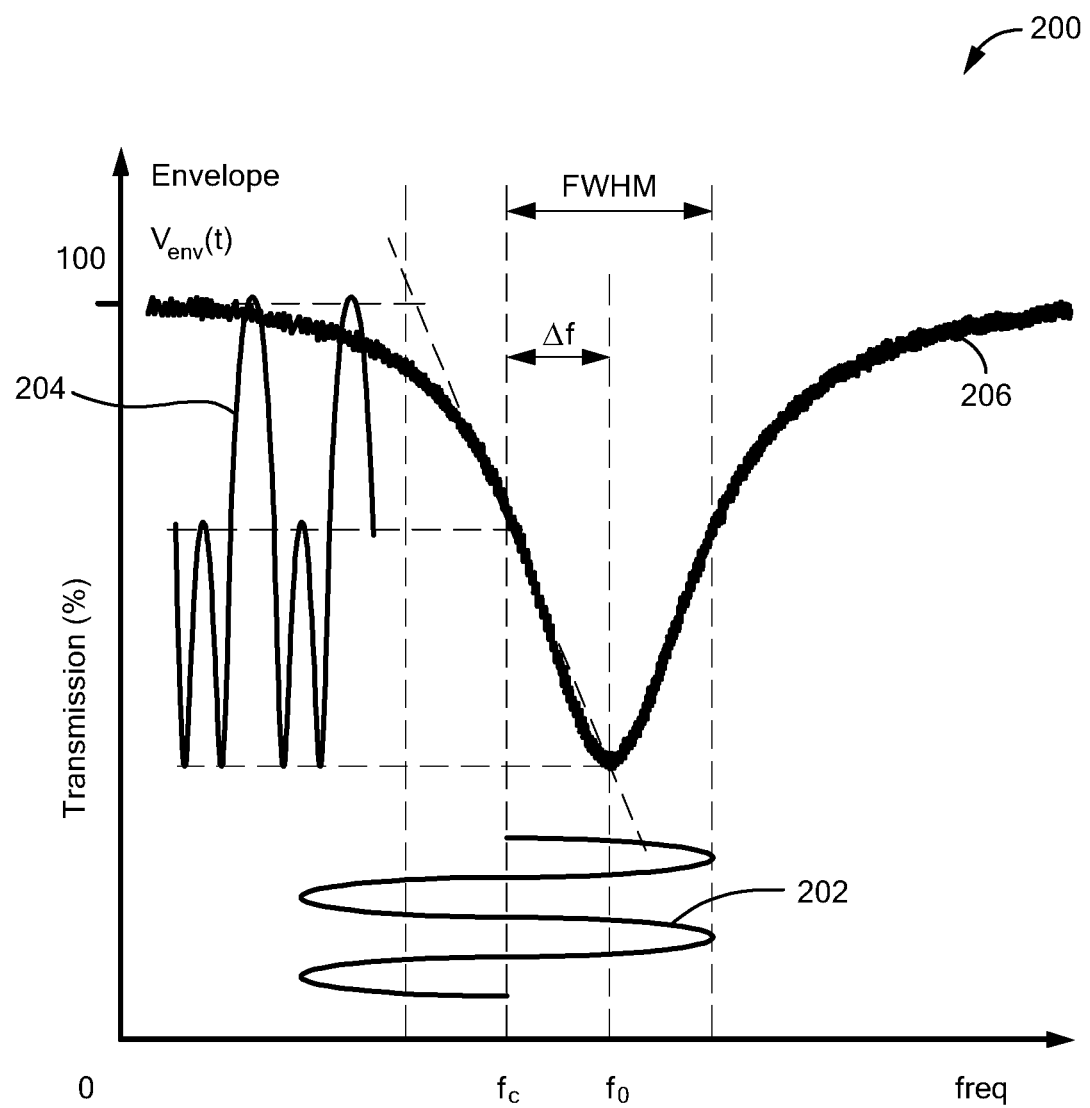
FIG. 2 is a plot illustrating an envelope of a modulated probing signal interacting with gaseous molecules within a molecular clock.

Turning briefly to FIG. 2, plot 200 illustrates how a probing signal 202 with center frequency $f_c$, modulation frequency $f_m$, and frequency deviation $\Delta f$ can generate envelope fluctuation, $V_{env}(t)$, 204 due to the absorption profile (Lorentz shape) of the rotational spectral line 206. A frequency offset ($f_c - f_0$) can lead to an absorption imbalance and cause envelope fluctuation (at $f_m$). As will be described further below, such fluctuations can be used to generate an error voltage in the receiver 106 and, in turn, establish a dynamic frequency compensation for VCO 110.

Referring again to FIG. 1, receiver 106 includes receive circuitry 120, a square-law detector 122, a low-noise amplifier (LNA) 124, and a lock-in detector 126. Receive circuitry 120 in combination with square-law detector 122 can include circuit components to down-convert the RF output signal 118 to generate a baseband signal 128. Baseband signal 128 is sometimes referred to herein as the envelope signal, $V_{env}(t)$. Receive circuitry 120 can include other components to process the RF output signal 118 including, for example, a band-pass filter to filter out unwanted frequency components of the RF output signal 118. It should be noted that there are at least two possible configurations for receive circuitry 120: one for heterodyne detection, which requires mixing with an external local oscillator; and another for square-law detection, which requires self-mixing. In the illustrative embodiment of FIG. 1, receiver 106 implements square-law detection 122 and, thus, an external local oscillator signal is not needed. LNA 124 can amplify the baseband signal 128 with gain $G_{BB}$, and the amplified baseband signal 130 can be provided to lock-in detector 126. In some embodiments, LNA 124 can be provided as a low-noise folded-cascade operational amplifier (op-amp).

Lock-in detector 126 can process the amplified baseband signal 130 to generate a receiver output signal (or "error signal") 132 having a voltage which indicates the size and offset of the frequency offset ($f_c$–$f_0$). Lock-in detector 126 can be referenced to the transmitter modulation frequency, $f_m$. For example, transmit circuitry 112 can provide a modulation reference output signal which lock-in detector 126 can compare with amplified baseband signal 130 to determine the size and offset of the frequency offset. An illustrative lock-in detector that can be used within molecular clock 100 is shown and described in "A CMOS Molecular Clock Probing 231.061-GHz Rotational Line of OCS with Sub-ppb Long-Term Stability and 66-mW DC Power," 2018 Symposium on VLSI Circuits (VLSI), Honolulu, Hi., 2018, pp. 113-114. Transmitter 102 and/or receiver 106 may be subject to various types of noise which is represented in FIG. 1 as a transceiver noise signal 134 with noise spectrum density of $V_{r,n}$ that is added to output signal ($V_r$) 132 to generate a "noisy" error signal 136.

Baseband circuitry 108 includes circuitry to process the noisy error signal 136 to generate the VCO control signal 138. In the example of FIG. 1, baseband circuitry 108 includes an amplifier 144 to gain adjust ($G_{DC}$) the noisy error signal 136 and a low-pass filter comprising resistor 146 and capacitor 148. The VCO control signal 138 provided as output of baseband circuitry 108 is fed back to transmitter VCO 110, thereby establishing frequency locking within the molecular clock 100 and providing a highly stably clock signal 114.

Transmitter 102, receiver 106, and baseband circuitry 108 may be collectively function as a spectrometer that wavelength modulates a probing signal which interacts with gaseous molecules contained within the waveguide gas cell 104.

By utilizing rotational spectral lines of gaseous molecules, molecular clock 100 may be capable of achieving frequency stability characteristics which are the same as or similar to those achieved using a chip-scale atomic clock (CSAS). In some instances, molecular clock 100 can utilize a rotational spectral line of gaseous molecules in the sub-THz region. A molecular clock using frequencies in the sub-THz range can achieve a relatively compact gas cell since the size of the gas cell is proportional to the wavelength. It should, however, also be appreciated that the rotational lines can be distributes from the microwave range of frequencies to the THz frequency range (GHz~THz), and most of the frequencies within these ranges can be used by molecular clock 10.

In some embodiments, molecular clock 100 can use molecules which remain in the gas phase under a wide temperature range; these types of molecules do not require atom evaporation carried out by a gas cell heater or other mechanism and typically used in conventional atomic clocks for alkali evaporation. Instead, molecular clock can be substantially instantaneously "turned-on" thereby enabling the molecular clock to provide a real-time response while eliminating the need for a gas cell heater and reducing the size of molecular clock 100.

In some instances, molecular clock 100 can achieve an absolute line width of about 1 MHz which is on the order of 1,000 times that of a CSAC and has a loop bandwidth of about 100 kHz. Such a relatively wide loop bandwidth produces a molecular clock that is largely unaffected by vibration.

Figure 3:
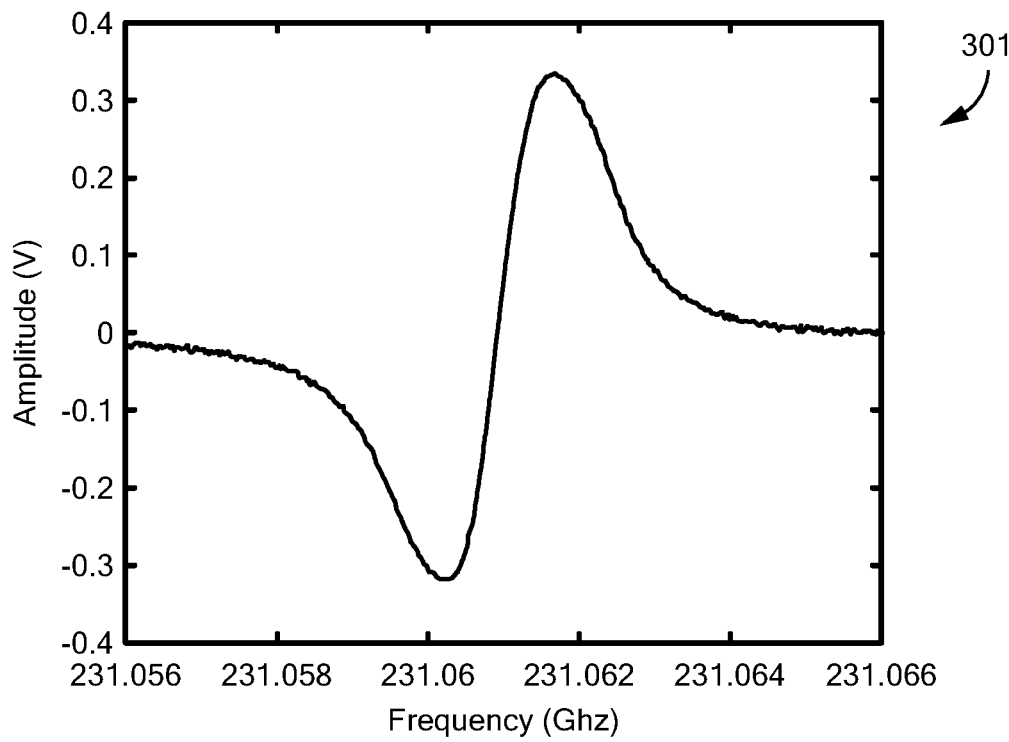
FIG. 3 shows dispersion curves for several harmonics of a modulated probing signal interacting with gaseous molecules within a molecular clock.
Figure 3:
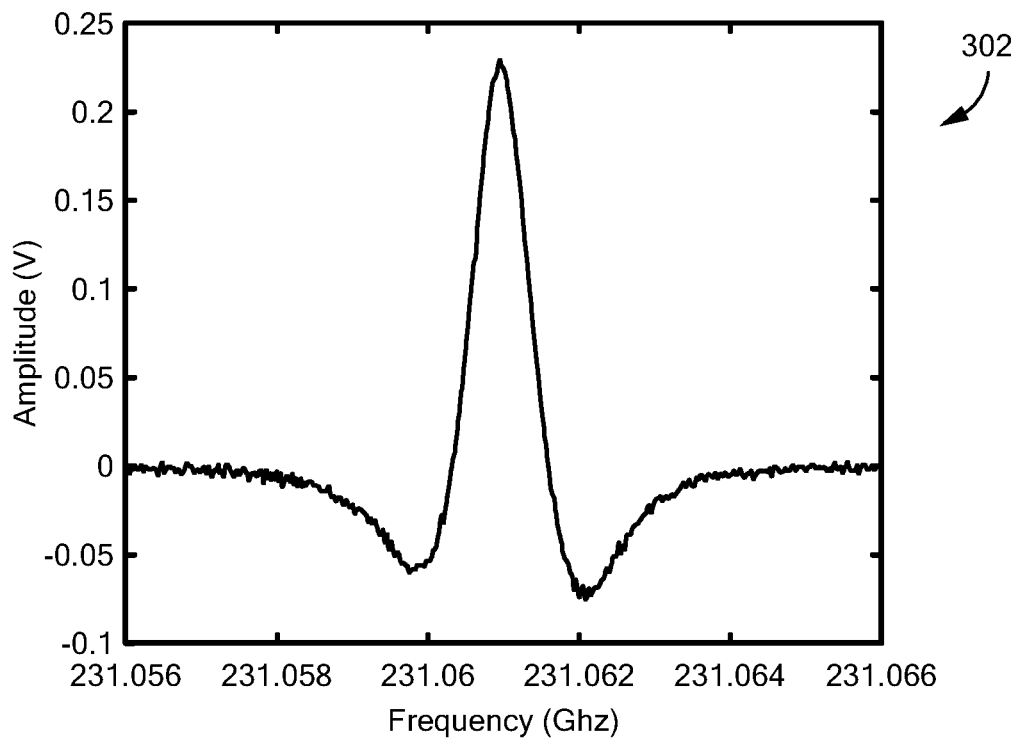
Figure 3:
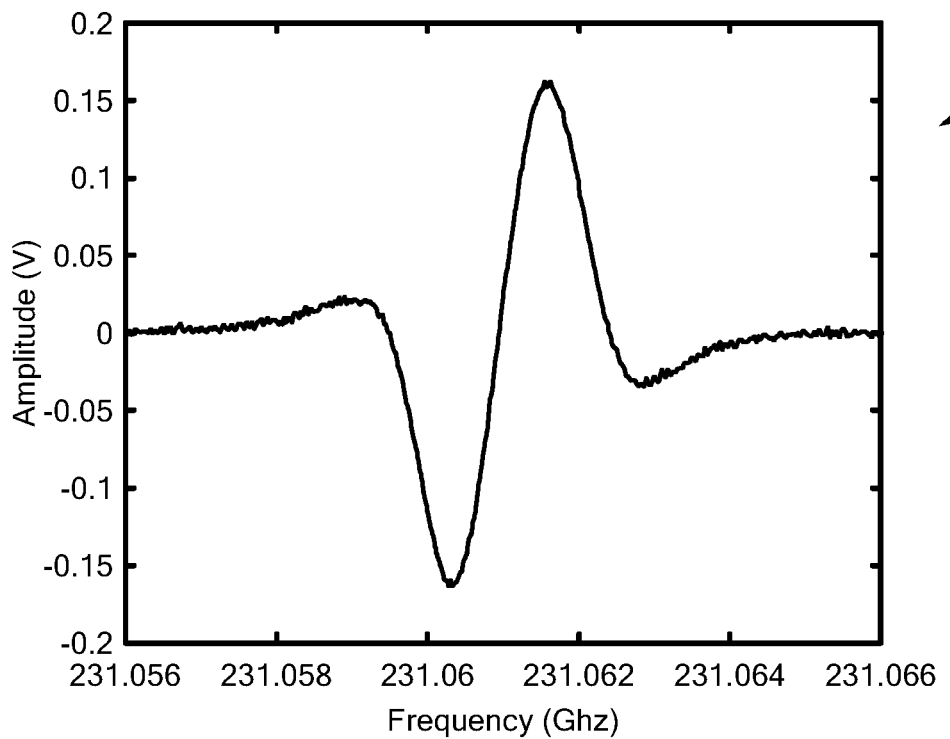
Figure 3:
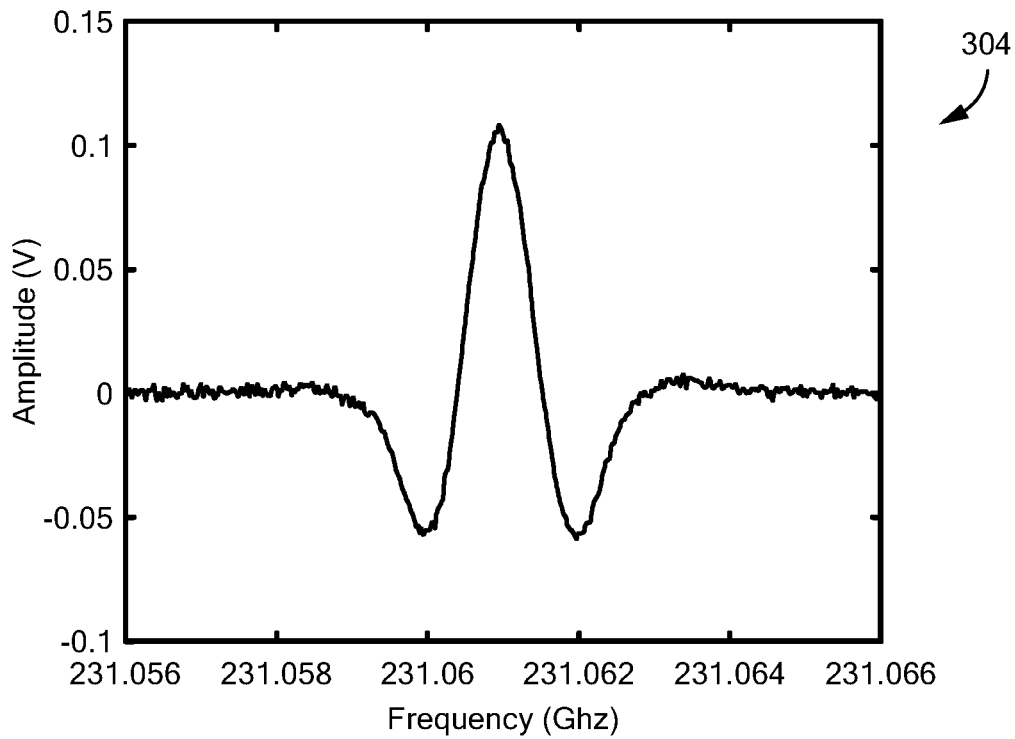

Turning to FIG. 3, by scanning $f_c$ around spectral line center $f_0$ and monitoring the frequency components of $V_{env}$ (t) at different harmonic frequencies, dispersion curves with different harmonic indexes can be obtained. For example, dispersion curve 301 may correspond to a first order harmonic (N=1), dispersion curve 302 may correspond to a second order harmonic (N=2), dispersion curve 303 may correspond to a third order harmonic (N=3), dispersion curve 304 may correspond to a fourth order harmonic (N=4), dispersion curve 305 may correspond to a fifth order harmonic (N=5), and dispersion curve 306 may correspond to a sixth order harmonic (N=6).

It is appreciated herein that a zero-crossing point exists at the spectral line center (f=$f_c$), and only exists for dispersion curves having odd order harmonics (e.g., N=1, 3, 5, etc.). For even order harmonics (e.g., N=2, 4, 6, etc.), a peak output voltage exists at the same location. To achieve a molecular clock with locking, a dispersion curve with an odd order harmonic must be used. In such a dispersion curve, the spectral line center contains not only the amplitude but also the phase information, which can be used to determine the frequency difference between the probing signal and spectral line center. Once this frequency difference is determined, a corresponding frequency adjustment can be conducted for clock stabilization.

The open-loop gain of a disclosed molecular clock can be determined as:

$$G_{open\text{-}loop} = K_v \cdot K_r \cdot G_{BB} \cdot G_{DC} \gg 0 \quad (1)$$

where:

$K_v$ is the response of transmitter, $K_v = (f_c - f_0)/\Delta V_{XO}$, and has units Hz/V;

$K_r$ is the response of receiver excluding baseband amplifier, $K_r = V_r/(f_c - f_0)$, and has units V/Hz;

$G_{BB}$ is the gain at the baseband amplifier which amplifies the envelope signal $V_{env}$ (t); and $G_{DC}$ is the DC gain.

For a precise frequency locking loop, the open-loop gain $G_{open\text{-}loop}$ should be sufficiently high, e.g. on the order of $10^4$. Given that $K_v$ and $K_r$ are constant for a fixed setup, only $G_{BB}$ and $G_{DC}$ can be adjusted. A higher gain at $G_{BB}$ is preferred to $G_{DC}$ because large input DC offset voltage drift of $G_{DC}$ due to temperature can lead to long-term clock drift. While locking onto an odd order dispersion curve, the signal amplitude of an even order dispersion curve is at the maximum. If a high gain is put on $G_{BB}$, the amplifier is easily driven to saturation and nonlinearity and higher noise can appear. The gain $G_{BB}$ is therefore limited by the signal amplitude of even harmonic frequency components at the baseband. Because of the peak signal amplitude of even-order harmonics at spectral line center, a disclosed molecular clock which locks onto odd-order harmonics has limited gain at $G_{BB}$. As a result, it is necessary to put a higher gain on $G_{DC}$ instead of $G_{BB}$ thereby leading to a demanding requirement on the input DC offset voltage drift of DC gain stages $G_{DC}$. Accordingly, to improve the accuracy and stability of a molecular clock, even order harmonics of the modulated probing signal should be suppressed to realize a higher gain on $G_{BB}$.

Of note, there exists two major noise sources in a molecular clock such as clock 100 of FIG. 1: (1) the phase noise of VCXO with an input referred noise spectrum density of $V_{xo,n}$; and (2) the noise of transceiver with a noise spectrum density of $V_{r,n}$. Both of the noise sources are reduced (and ideally, entirely suppressed) by the open loop gain $G_{DC}$ after locking, if located within the loop bandwidth. By assuming that the noise spectrum density $V_{r,n}$ dominates, the short-term Allan deviation $\sigma_y$ of the molecular clock may be expressed by the slope of measured dispersion curve $K_r$ and the noise spectrum density $V_{r,n}$ as follows:

$$\sigma_y(\tau) = \frac{V_{r,n}}{\sqrt{2\tau \cdot K_r \cdot f_0}} \approx \frac{K_N}{Q \cdot SNR \cdot \sqrt{\tau}}, \quad (2)$$

In which:
 $\tau$ is the averaging time;
 $f_0$ represents the spectral line center;
 $K_N$ is a constant, which depends upon the selected harmonics (e.g. if the fundamental dispersion, N=1, is selected, $K_N \approx 0.2$);
 Q is a quality factor of the spectral line; and
 SNR is the signal to noise ratio of the spectral line.

The quality factor of spectral line is defined as $Q=f_0/$FWHM, where $f_0$ is the center frequency and FWHM is the full width at half maximum. The quality factor is determined by several mechanisms including, but not limited to: (1) the natural linewidth, due to disturbance of zero-point vibration of electromagnetic fields, is around 0.1 Hz ($Q \approx 10^{12}$) for the sub-THz band; and (2) under low pressure, Doppler effect from the Brownian motion causes spectral-line broadening.

As shown in Equation 2, by assuming a Lorentz line profile, the short-term Allen deviation $\sigma_y$ can also be expressed as the product of quality factor Q and SNR. For a fundamental dispersion curve, $K_1 \approx 0:2$. Thus, there exists a concomitant relationship between the value of the SNR-quality factor Q product and short-term frequency stability. Specifically, the higher the value of the product of SNR and quality factor Q, the better the short-term frequency stability characteristic of the clock signal.

In addition, the SNR decreases by 6 dB as the harmonic number N increases by two (2), due to the reduction of signal amplitude of the harmonic vis-à-vis the amplitude of the fundamental. Thus, a molecular clock locking to the fundamental dispersion curve produces a clock signal having a short-term stability characteristic which is better than a short-term stability characteristic of a clock signal produced by a molecular clock locking to a harmonic dispersion curve.

Figure 4:
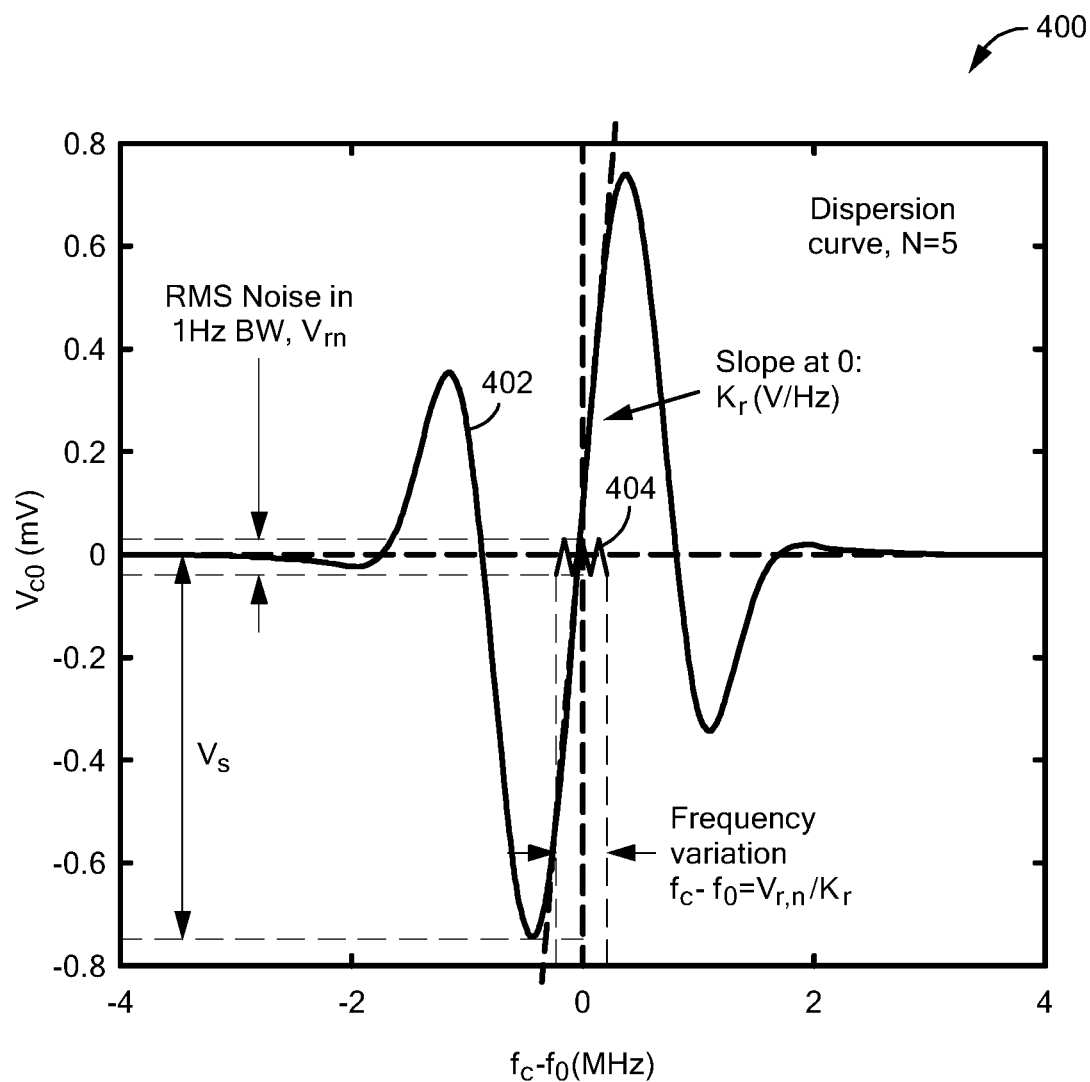
FIG. 4 is a plot illustrating a fifth order dispersion curve, which includes a zero-crossing point that the molecular clock locks onto.

However, high order harmonic dispersion curves are also not trivial, which exhibit better long-term stability due to the improved symmetry. In general, the symmetry of the spectral line is negatively affected by the frequency non-flatness of the probing system (i.e. the transmitted (TX), receiver (RX) and gas cell), which will deteriorate the long-term stability of the clock due to environment variations. However, the non-flatness of the probing system is smoother than the absorption of spectral line. As a result, locking onto a high order dispersion curve (e.g., N=5) instead of the fundamental dispersion curve, the effect of mentioned non-flatness will be reduced, but the signal from spectral line itself still stays significant. Then, better long-term stability may be achieved. FIG. 4 shows an illustrative plot 400 having a fifth order dispersion curve 402, which includes a zero-crossing point 404 that a molecular clock (e.g., clock 100 of FIG. 1) can lock onto.

Figure 5:
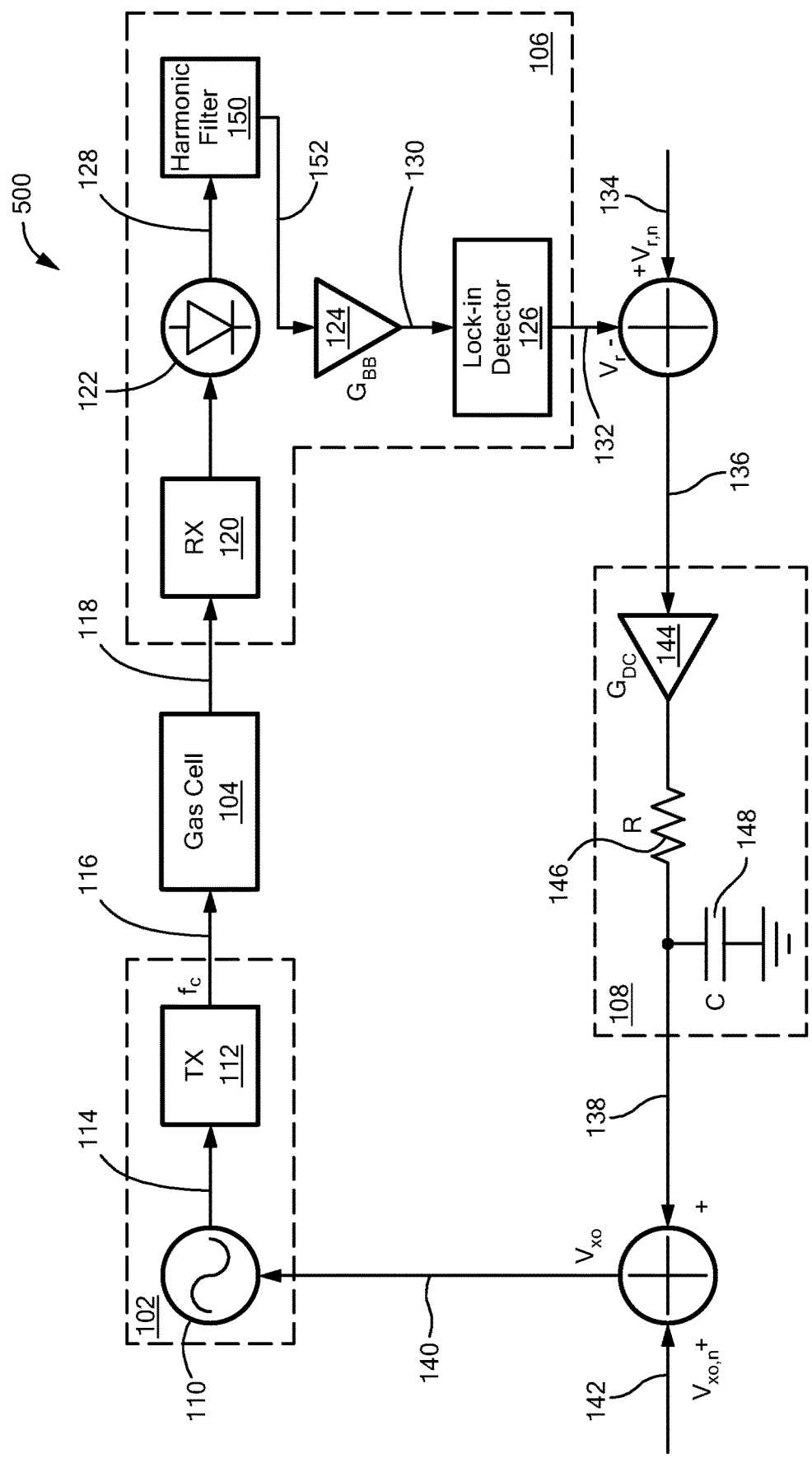
FIG. 5 is a schematic diagram of a molecular clock configured to surpass even harmonics, account to some embodiments of the present disclosure.

FIG. 5 shows an example of a molecular clock 500 configured to surpass even harmonics, account to some embodiments of the present disclosure. The structure and operation of molecular clock 500 of FIG. 5 may be similar to that of molecular clock 100 of FIG. 1 and, for simplicity of explanation, like reference numerals identify like elements between these figures.

The illustrative molecular clock 500 includes a harmonics filter 150 coupled between the square-law detector 122 and the baseband LNA 124 of the receiver 106. Harmonics filter 150 is configured to receive the (pre-amplified) baseband signal 128 and to generate a filtered baseband signal 152 wherein even harmonic components are suppressed (and ideally eliminated). The filtered baseband signal 152 can then be fed to the baseband LNA 124, as shown. In some embodiments, harmonics filter 150 may be implemented "on-chip," meaning it can share the same silicone with other components of the receiver 106, such baseband LNA 124.

Figure 6:
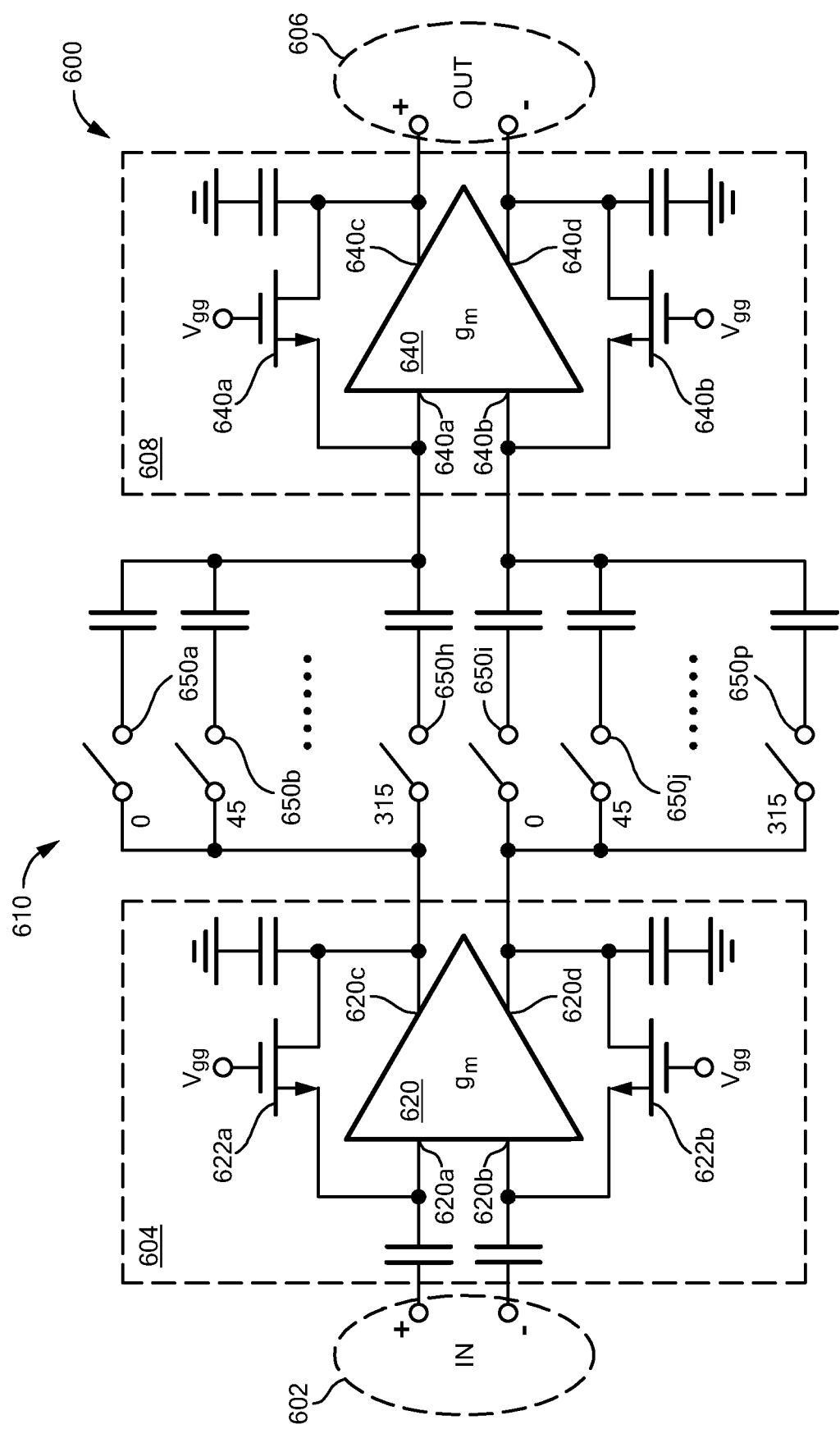
FIG. 6 illustrates a schematic of a harmonics filter that can be used within a molecular clock, account to some embodiments of the present disclosure.

FIG. 6 shows an example of a harmonics filter 600 that can be implemented, for example, within the molecular clock of FIG. 5. Harmonics filter 600 can be used to eliminate the even harmonic components at gain $G_{BB}$ stages. In contrast to some conventional notch filters, filter 600 can be used without using external capacitance. Harmonics filter 600 can function as a low-pass, high-pass, or bandpass filter to select the desired RF channels such as RF channels associated with odd-order harmonics of a dispersion curve as discussed herein.

Harmonics filter 600 includes an input port 602 configured to receive an input signal (e.g., baseband signal 128 in FIG. 5) and an output port 606 configured to provide a filtered output signal (e.g., filtered baseband signal 152 in FIG. 5). Input port 602 is coupled to an input buffer 604 and an output port 606 coupled to an output buffer 608. In some instances, buffers 604, 608 (or "differential gain stages") can be provided as high-impedance amplifiers capable of amplifying or attenuating an input signal prior to filtering. In other instances, buffers 604, 606 can be provided as transconductance amplifiers.

In the embodiment of FIG. 6, input buffer 604 can include a transconductance cell 620, a first transistor 622a, and a second transistor 622b. Transconductance cell 620 includes a first input terminal 620a coupled to a positive terminal of input port 602 and to a source terminal of first transistor 622a, and a second input terminal 620b coupled to a negative terminal of input port 602 and to a source terminal of second transistor 622b. Transconductance cell 620 further includes a first output terminal 620c coupled to a drain terminal of first transistor 622a, and a second output terminal 620d coupled to a drain terminal of second transistor 622b.

Also in the embodiment of FIG. 6, output buffer 608 can include a transconductance cell 640, a first transistor 640a, and a second transistor 640b. Transconductance cell 640 includes a first input terminal 640a coupled to a source terminal of first transistor 640a, and a second input terminal 640b coupled to a source terminal of second transistor 642b. Transconductance cell 640 further includes a first output terminal 640c coupled to a drain terminal of first transistor 642a and to a positive terminal of output port 606, and a second output terminal 640d coupled to a drain terminal of second transistor 642b and to a negative terminal of output port 606.

Transconductance cells 620, 640 can each have a gain, $g_m$, that can be chosen such that the input referred noise of harmonics filter 600 is lower than that of the molecular clock lock-in detector (e.g., detector 126 of FIG. 5). That is, a transconductance cell gain, $g_m$, can be chosen based on the input referred noise of an op-amp located between the harmonics filter and the lock-in detector (e.g., op-amp 124 of FIG. 5).

An N-path notch filter 610 connects the input and output buffers 604, 608. N-path notch filter 610 can include a plurality of switches 650a, 650b, etc. (650 generally) configured to periodically oscillate between states (e.g., from open to closed, and vice-versa) at a predetermined switching frequency. In some embodiments, switches 650 are configured to oscillate at a frequency $2f_m$, where $f_m$ is the modulation frequency of the molecular clock in which filter 600 is used. The N-path notch filter 610 can have a differential structure, with N switches connected to a positive branch and N switches connected to a negative branch (for a total of 2N switches). On each branch, the switches may oscillate in non-overlapping manner (i.e., on a given branch, the phases of the N switches may be staggered between 0 and 360 degrees).

In the example of FIG. 6, N-path notch filter 610 is an 8-path notch filter with eight (8) switches 650a-650h on the positive branch and eight (8) switches 650i-650p on the negative branch. The positive branch switches 650a-650h are connected in parallel, each having a first terminal coupled to output terminal 620c of transconductance cell 620 and a second terminal coupled to input terminal 640a of transconductance cell 640. The positive branch switches 650a-650h can be configured to have respective phases 0, 45, 90, 135, 180, 225, 270, and 315 degrees. The negative branch switches 650i-650p are connected in parallel, each having a first terminal coupled to output terminal 620d of transconductance cell 620 and a second terminal coupled to input terminal 640b of transconductance cell 640. The negative branch switches 650i-650p can be configured to have respective phases 0, 45, 90, 135, 180, 225, 270, and 315 degrees.

Switches 650 can be a field effect transistor, a metal-oxide field effect transistor, or any other type of transistors or switches. Each switch may be coupled in series with a capacitor, as shown. In some embodiments, the capacitors used in conjunction with the switches 650 can be 10 pF capacitors that consist of overlapping metal-insulator-metal and metal-oxide-metal capacitors. It should be appreciated that the capacitors can have any value suitable for achieving the described N-path notch filtering.

Harmonics filter 600 can be fully integrated on-chip. In order to ensure sharp notch filtering at the even-order harmonic frequencies, and substantially no filtering at the odd-order harmonic frequencies, the buffers 604, 608 can have a high input impedance. In some embodiments, transistors 622a, 622b, 640a, 640b may be provided as NMOS transistors serving as feedback resistors to achieve a high input impedance.

In some instances, harmonics filter 600 can be implemented on a 65 nm complementary metal-oxide-semiconductor (CMOS) process. The design of the filter 600 can be such that it eliminates even-order harmonics of $V_{env}(t)$ with a modulation frequency, $f_m=100$ kHz. In such a design, the clock frequency of the N-path notch filter is twice the modulation frequency, or $2f_m=200$ kHz. In other instances, a 2.5V device can be used for larger off-state resistance.

In still other embodiments, the harmonics filter 600 can include a low-pass filter positioned after the output buffer 608. This low-pass filter can be configured to remove the up-converted frequency components generated as a result of the 2 fm clock frequency of the harmonics filter 600. In other instances, this low-pass filter is not included in the harmonics filter 600 (even harmonic eliminator) and included within the molecular clock 100 in the forward path from the output buffer 608 of harmonics filter 600.

Figure 7:
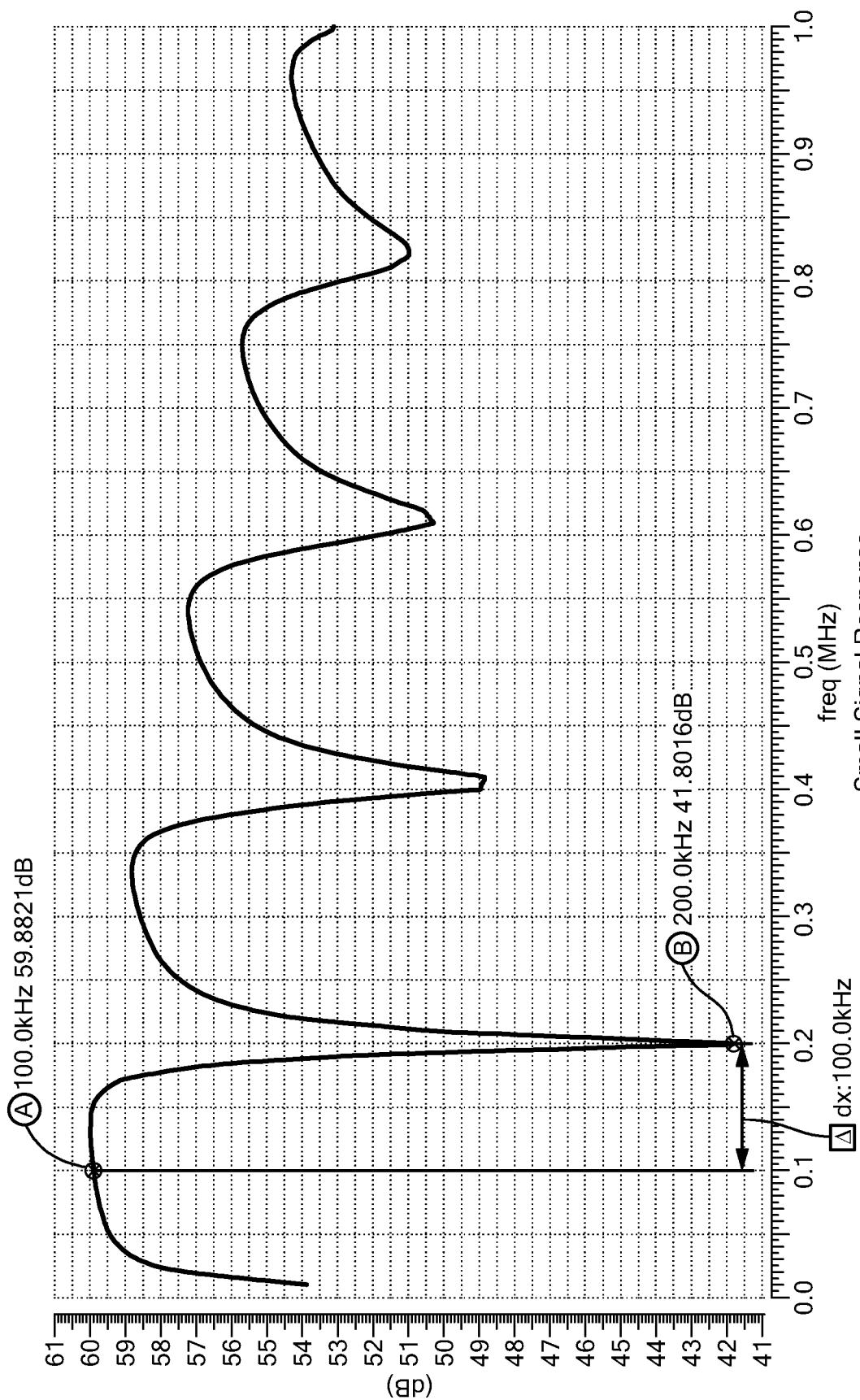
FIG. 7 is a plot of a small baseband response to the harmonics filter of FIG. 6.
Figure 8:
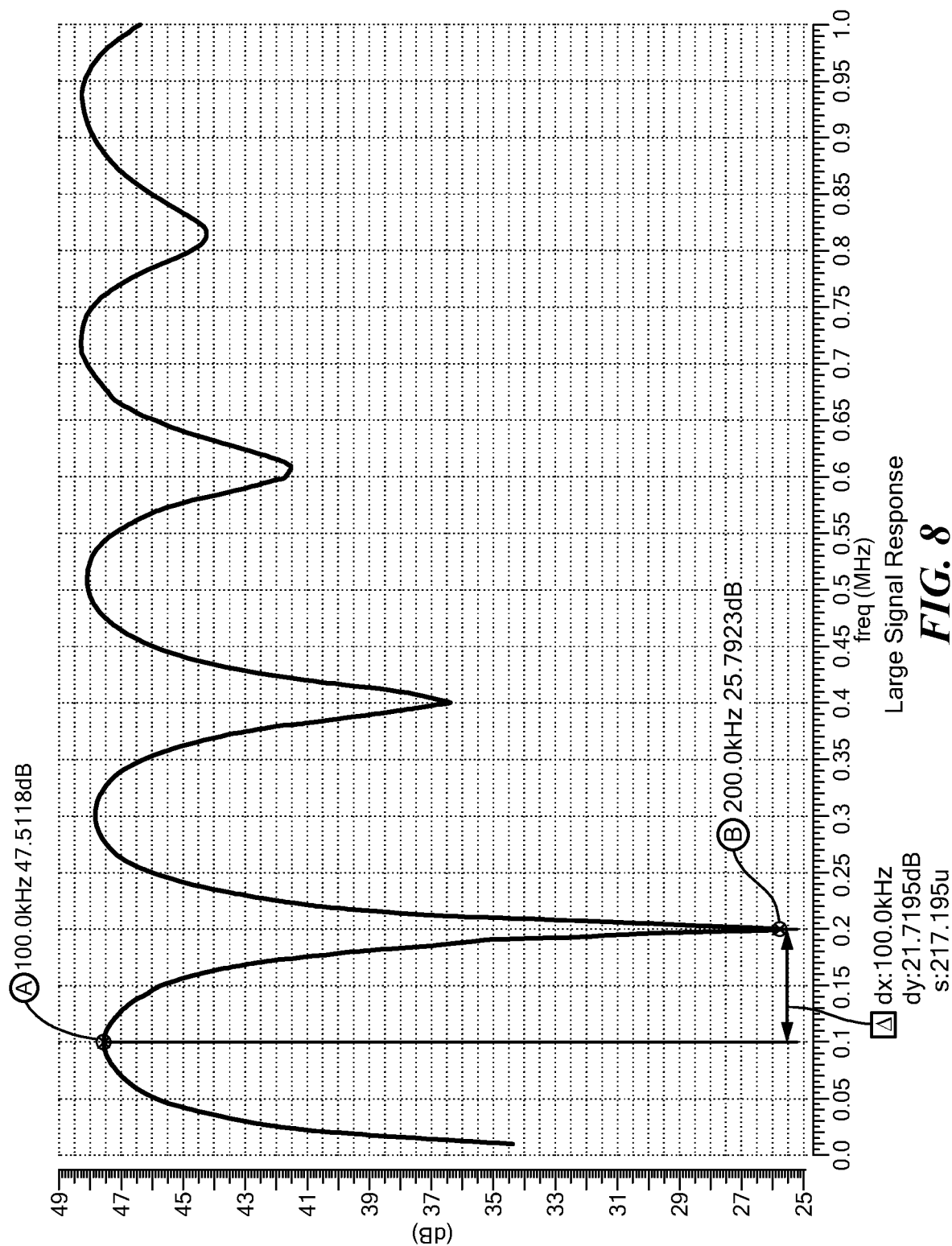
FIG. 8 is a plot of a large baseband response to the harmonics filter of FIG. 6.

Illustrated in FIGS. 7 and 8 are respective plots of small signal and large signal baseband responses to harmonics filter 600.

In the small signal response of FIG. 7, the gain at the modulation frequency, $f_m$, is approximately 18.1 dB higher than the $2^{nd}$ harmonic at $2f_m$. For the small signal response of FIG. 7, there is approximately a 59.88 dB gain at 100 kHz or $f_m$. For the large signal response of FIG. 8 (Vin=2 mV), the $2^{nd}$ harmonic rejection achieves 21.7 dB. For the large signal response of FIG. 8, there is approximate a 47.5 dB gain at 100 kHz or $f_m$, and the response is achieved by using $2f_m$ (200 kHz) with a 2 mV interference. These responses demonstrate that the ability of the N-path filter 600 to filter out even-order harmonics is less affected by the gain compression. In particular, the proposed filter 600 can reasonably reject all high order even harmonic components. Therefore, by using the proposed harmonics filter 600 which locks onto the odd-order harmonic dispersion curves for the molecular clock feedback loop, the even-order harmonic components can be significantly suppressed. Additionally, even-order harmonics can be up-converted to high frequencies by the fast switching of $2f_m$ clock frequency of the harmonics filter 600 (even harmonic eliminator). Eliminating the even-order harmonics can ensure a clean output spectrum.

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

All publications and references cited herein are expressly incorporated herein by reference in their entirety.

The invention claimed is:

1. A molecular clock comprising:
a waveguide gas cell containing gas molecules having a rotational spectral line with a first frequency;

a voltage-controlled oscillator (VCO) to generate a clock signal;

a transmitter referenced to the clock signal to generate a probing signal for transmission through the waveguide gas cell; and a receiver to receive the probing signal transmitted through the waveguide gas cell and interacting with gas molecules, the receiver comprising:

a filter circuit configured to filter out even harmonic components from the received signal; and a lock-in detector to generate an error signal indicating an offset between the first frequency and the second frequency, wherein the error signal is fed back to control generation of the VCO clock signal.

2. The molecular clock of claim 1, wherein the filter circuit comprises a N-path notch filter.

3. The molecular clock of claim 2, wherein the N-path notch filter comprises an input buffer and an output buffer.

4. The molecular clock of claim 3, wherein the input buffer and output buffer each comprise a transconductance amplifier.

5. The molecular clock of claim 3, wherein the input buffer and output buffer each comprise a high impedance buffer.

6. The molecular clock of claim 2, wherein the N-path notch filter comprises multiple switches, each switch configured to oscillate at a frequency equal to twice a modulation frequency of the spectrometer.

7. The molecular clock of claim 1, wherein the gaseous molecules comprise gaseous molecules having a linear structure.

8. The molecular clock of claim 7, wherein the gaseous molecules having a linear structure are provided as carbonyl sulfide compound (OCS).

9. A molecular clock comprising:

a waveguide gas cell having a radio frequency (RF) input port, a RF output port and a gas inlet and outlet;

a spectrometer configured to wavelength modulate a spectral signal from gaseous molecules contained within the waveguide gas cell;

a filter circuit configured to filter out even harmonic components from the wavelength modulated spectral signal and a lock-in detector to generate a signal for controlling the molecular clock, wherein the filter circuit is coupled between the spectrometer and the lock-in detector.

10. The molecular clock of claim 9, wherein the gaseous molecules comprise gaseous molecules having a linear structure.

11. The molecular clock of claim 10, wherein the gaseous molecules having a linear structure are provided as carbonyl sulfide compound (OCS).

12. The molecular clock of claim 11, wherein the carbonyl sulfide compound (OCS) is provided having a rotational spectrum in the frequency range of about 12 GHz to about 1 THz.

13. The molecular clock of claim 11, wherein the carbonyl sulfide compound (OCS) is provided having a rotational spectrum in the frequency range of about 200 GHz to about 300 GHz.

14. The molecular clock of claim 9, wherein the spectral signal from the gaseous molecules comprises a rotational spectral line.

15. The molecular clock of claim 10, wherein the filter circuit comprises a N-path notch filter.

16. The molecular clock of claim 15, wherein the N-path notch filter comprises an input buffer and an output buffer.

17. The molecular clock of claim 16, wherein the input buffer and output buffer each comprise a transconductance amplifier.

18. The molecular clock of claim 16, wherein the input buffer and output buffer each comprise a high impedance buffer.

19. The molecular clock of claim 15, wherein the N-path notch filter comprises multiple switches, each switch configured to oscillate at a frequency equal to twice a modulation frequency of the spectrometer.

20. The molecular clock of claim 9, comprising a low-pass filter configured to remove up-converted frequency components from the spectral signal.

* * * * *